United States Patent
Wang et al.

(10) Patent No.: US 9,264,815 B2
(45) Date of Patent: Feb. 16, 2016

(54) SILICON CONDENSER MICROPHONE

(71) Applicants: Kai Wang, Shenzhen (CN); Zhijiang Wu, Shenzhen (CN)

(72) Inventors: Kai Wang, Shenzhen (CN); Zhijiang Wu, Shenzhen (CN)

(73) Assignee: AAC Acoustic Technologies(Shenzhen) Co., Ltd., Shenzhen (CN)

( * ) Notice: Subject to any disclaimer, the term of this patent is extended or adjusted under 35 U.S.C. 154(b) by 0 days.

(21) Appl. No.: 14/284,651

(22) Filed: May 22, 2014

(65) Prior Publication Data

US 2015/0189446 A1    Jul. 2, 2015

(30) Foreign Application Priority Data

Dec. 30, 2013   (CN) .................. 2013 2 0881507 U

(51) Int. Cl.
  *H04R 19/04*   (2006.01)
  *H04R 19/00*   (2006.01)

(52) U.S. Cl.
  CPC .............. *H04R 19/04* (2013.01); *H04R 19/005* (2013.01)

(58) Field of Classification Search
  CPC ........ H04R 19/04; H04R 19/005; H04R 1/08; H04R 9/08; H04R 11/04; H04R 17/02; H04R 21/02; H04R 1/02; H04R 1/105
  USPC .......................... 381/174–175, 355, 361, 369
  See application file for complete search history.

(56) References Cited

U.S. PATENT DOCUMENTS 3,775,572 A * 11/1973 Ishibashi et al. .............. 381/174
6,870,938 B2 *  3/2005 Takeuchi et al. .............. 381/175
8,902,604 B2 * 12/2014 Zoellin et al. ................. 381/175

* cited by examiner

*Primary Examiner* — Suhan Ni
(74) *Attorney, Agent, or Firm* — IPro, Inc.; Na Xu

(57) ABSTRACT

A silicon condenser microphone is disclosed. The silicon condenser microphone includes a substrate having a top surface, a lower surface opposed to the top surface, and a recess concave from the top surface toward the lower surface. The recess includes a bottom for carrying a chip thereon. The microphone further includes a transducer spanning the recess. By virtue of this configuration, the size of the microphone is reduced, and acoustic performance of the microphone is accordingly improved.

14 Claims, 2 Drawing Sheets

SILICON CONDENSER MICROPHONE

FIELD OF THE INVENTION

The present invention relates to microphones, more particularly to a low profile silicon condenser microphone.

DESCRIPTION OF RELATED ART

With the rapid development of wireless communication technologies, mobile phones are widely used in daily life. Users require mobile phones to not only have voice function, but also have high quality voice performance. In addition, with the development of mobile multi-media technologies, sounds, like music, voice, are of importance to a device for generating the multi-media functions. As a sound pick-up device, a microphone is a necessary component used in a mobile phone for converting sounds to electrical signals.

Miniaturized silicon microphones have been extensively developed for over sixteen years, since the first silicon piezoelectric microphone reported by Royer in 1983 . In 1984, Hohm reported the first silicon electret-type microphone, made with a metallized polymer diaphragm and silicon backplate. And two years later, he reported the first silicon condenser microphone made entirely by silicon micro-machining technology. Since then a number of researchers have developed and published reports on miniaturized silicon condenser microphones of various structures and performance. U.S. Pat. No. 5,870,482 to Loeppert et al reveals a silicon microphone. U.S. Pat. No. 5,490,220 to Loeppert shows a condenser and microphone device. U.S. Patent Application Publication 2002/0067663 to Loeppert et al shows a miniature acoustic transducer. U.S. Pat. No. 6,088,463 to Rombach et al teaches a silicon condenser microphone process. U.S. Pat. No. 5,677,965 to Moret et al shows a capacitive transducer. U.S. Pat. Nos. 5,146,435 and 5,452,268 to Bernstein disclose acoustic transducers. U.S. Pat. No. 4,993,072 to Murphy reveals a shielded electret transducer.

Various microphone designs have been invented and conceptualized by using silicon micro-machining technology. Despite various structural configurations and materials, the silicon condenser microphone consists of four basic elements: a movable compliant diaphragm, a rigid and fixed backplate (which together form a variable air gap capacitor), a voltage bias source, and a pre-amplifier. These four elements fundamentally determine the performance of the condenser microphone. In pursuit of high performance; i.e., high sensitivity, low bias, low noise, and wide frequency range, the key design considerations are to have a large size of diaphragm and a large air gap. The former will help increase sensitivity as well as lower electrical noise, and the later will help reduce acoustic noise of the microphone. The large air gap requires a thick sacrificial layer. For releasing the sacrificial layer, the backplate is provided with a plurality of through holes.

As known, a silicon condenser microphone is also named MEMS (Micro-Electro-Mechanical-System) microphone. A microphone related to the present application generally includes a substrate, a housing forming a volume cooperatively with the substrate, a MEMS die accommodated in the volume, and an ASIC (Application Specific Integrated Circuit) chip received in the volume and electrically connected with the MEMS die. Both the ASIC chip and the MEMS die are mounted on the surface of the substrate, which configuration forces the microphone to have a sufficient volume to accommodate the components mentioned above therein. As the mobile phone is being designed to be thinner and thinner, there is no sufficient space provided to such a microphone having such a big volume.

Accordingly, an improved silicon condenser microphone which can overcome the disadvantage described above is desired.

BRIEF DESCRIPTION OF THE DRAWINGS

Many aspects of the embodiment can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION OF THE EXEMPLARY EMBODIMENTS

The present invention will hereinafter be described in detail with reference to exemplary embodiments.

Figure 1:
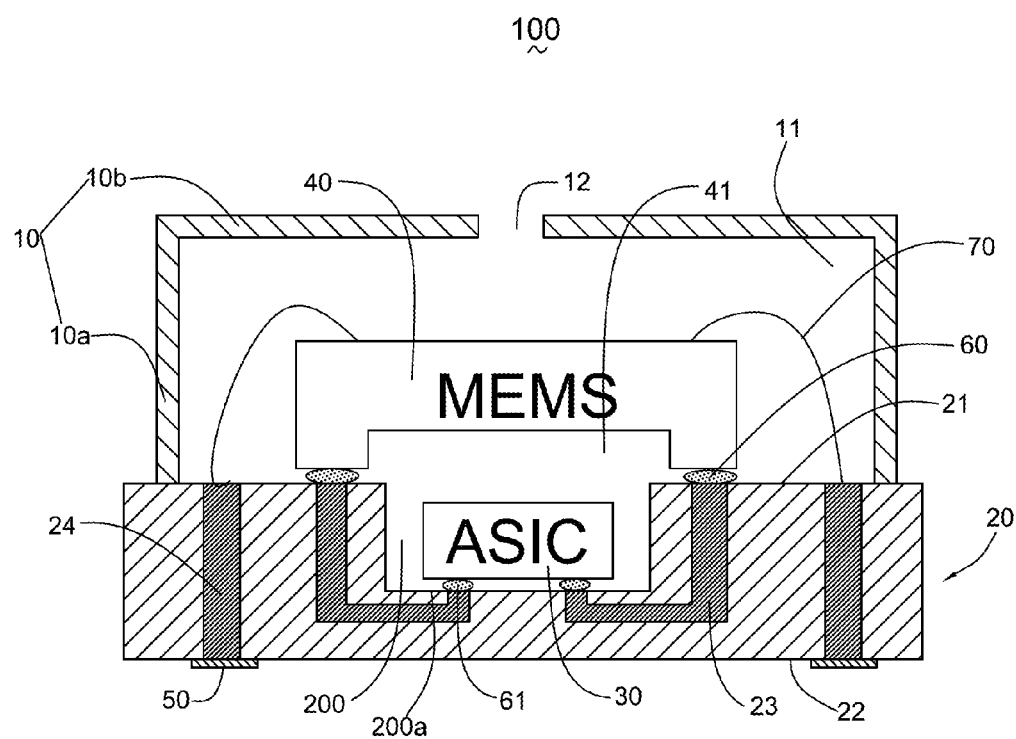
FIG. 1 is an illustrative cross-sectional view of a silicon condenser microphone in accordance with a first exemplary embodiment of the present disclosure.

Referring to FIG. 1, a silicon condenser microphone 100, in accordance with a first embodiment of the present disclosure, is used in an electronic device, such as a mobile phone, a handheld gaming, a multi-media player, a GPS navigator, or a like, for converting electrical signals to audible sounds. The silicon condenser microphone 100 comprises a substrate 20, and a cover 10 mounted with the substrate 20 for forming a cavity 11. The substrate 20 may be a normal printed circuit board, or be an element comprising a plurality of conductive layers and a plurality of non-conductive layers. The cover 10 comprises a sidewall 10a and a top 10b integrated with the sidewall 10a . The sidewall 10a determines a distance from the top 10b to the substrate 20, and substantially determines the height of the silicon condenser microphone 100. The sidewall 10a and the top 10b may be a one-piece configuration, or the sidewall 10a and the top 10b may be two separated elements coupled to each other by ordinary connection means. A combination of the cover 10 and the substrate 20 is defined as a housing of the silicon condenser microphone 100. The housing includes an acoustic aperture 12. In this embodiment, the acoustic aperture 12 is provided in the top 10b of the cover 10. The acoustic aperture 12 is used for transmitting external sound waves into the cavity 11. Alternatively, the acoustic aperture may be defined in the substrate 20. The substrate 20 includes a top surface 21, and a recess 200 concave from the top surface 21. The recess 200 comprises a bottom 200a.

The silicon condenser microphone 100 further comprises a chip such as an ASIC (Application Specific Integrated Circuit) chip 30 and a transducer unit such as a MEMS die 40 having a volume 41. The MEMS die 40 is accommodated in the cavity 11, and mounted on the top surface 21 of the substrate 20. While mounted, the MEMS die 40 spans the recess 200, and the volume of the MEMS die 40 communicates with the recess 200. The ASIC chip 30 is received in the recess 200 and is mounted on the bottom 200a. Thus, the MEMS die 40 is configured to stack above the ASIC chip 30. A height of the ASIC chip 30 is not greater than a depth of the recess 200. Accordingly, the ASIC chip 30 has no part exposed out of the recess 200.

By virtue of the configuration described above, the cavity 11 of the silicon condenser microphone 100 is reduced as it is only designed to receive the MEMS die 40, not both the MEMS die 40 and the ASIC chip 30.

The substrate 20 further comprises a plurality of first conductive paths 23 embedded therein for electrically connecting the MEMS die 40 to the ASIC chip 30. Optionally, the first conductive path 23 may be conductive wires embedded in the substrate 20, or a conductive hole with an inner side coated with conductive layers. One end of the first conductive path 23 electrically connects to the MEMS die 40 via a plurality of first conductive members 60, and the other end of the first conductive path 23 electrically connects to the ASIC chip 40 via a plurality of second conductive members 61. Optionally, the first conductive path 23 starts at the top surface 21 of the substrate 20, and ends at the bottom 200a of the recess 200.

The substrate 20 further includes a lower surface 22 opposed to the top surface 21. A plurality of electrodes 50 are arranged on the lower surface 22 for electrically connecting to external circuits. For electrically connecting the MEMS die 40 to the external circuit, the substrate 20 provides a plurality of second conductive paths 24 embedded therein. The second conductive path 24 starts at the top surface 21 of the substrate 20 for electrically connecting to the MEMS die 40, and ends at the lower surface 22 for electrically connecting to the electrodes 50. In this embodiment, the second conductive path 24 electrically connects to the MEMS die 40 via conductive wires 70.

By virtue of the configuration as described above, the ASIC chip is accommodated in the substrate, which reduces the volume of the microphone and make the microphone smaller. In addition, the MEMS die spans and communicates with the recess, which enlarges the back volume of the MEMS die for improving the acoustic performance of the microphone.

Figure 2:
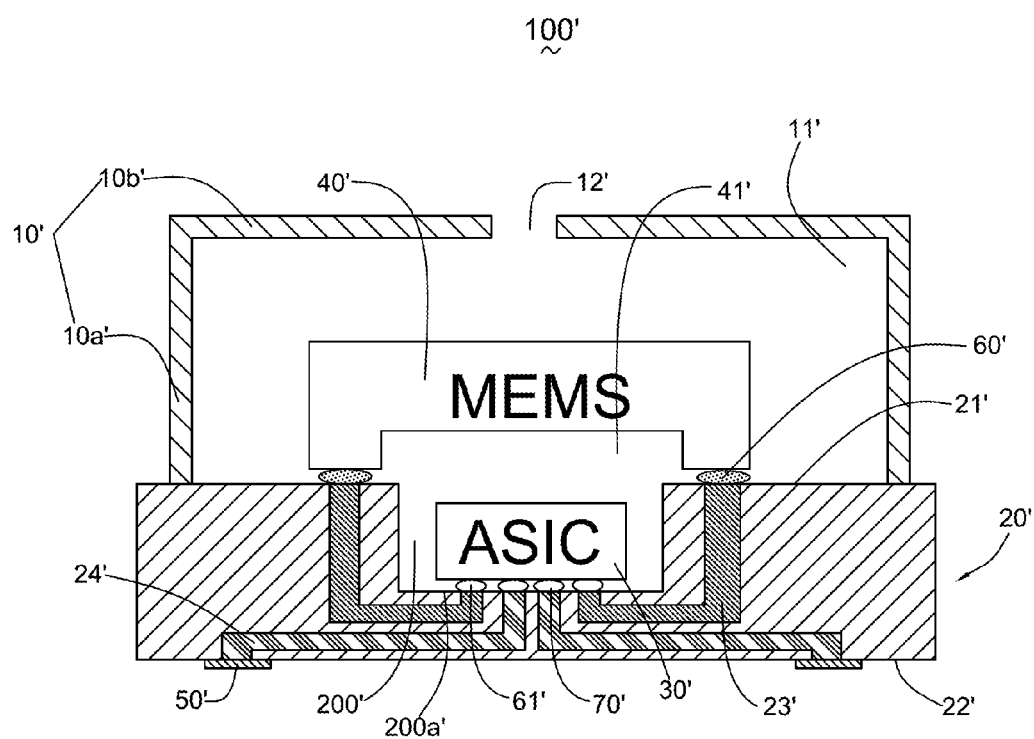
FIG. 2 is an illustrative cross-sectional view of a silicon condenser microphone in accordance with a second exemplary embodiment of the present disclosure.

Referring to FIG. 2, a silicon condenser microphone 100', in accordance with a second embodiment of the present disclosure, is used in an electronic device, such as a mobile phone, a handheld gaming, a multi-media player, a GPS navigator, or a like. The silicon condenser microphone 100' comprises a substrate 20', and a cover 10' mounted with the substrate 20' for forming a cavity 11'. The substrate 20' may be a normal printed circuit board, or be an element comprising a plurality of conductive layers and a plurality of non-conductive layers. The cover 10' comprises a sidewall 10a' and a top 10b' integrated with the sidewall 10a'. The sidewall 10a' determines the distance between the top 10b' and the substrate 20', and substantially determines the height of the silicon condenser microphonem. The sidewall 10a' and the top 10b' may be a one-piece configuration, or the sidewall 10a' and the top 10b' may be two separated elements coupled to each other by ordinary connection means. A combination of the cover 10' and the substrate 20' is defined as a housing of the silicon condenser microphone 100'. The housing includes an acoustic aperture 12'. In this embodiment, the acoustic aperture 12' is provided in the top 10b' of the cover 10'. The acoustic aperture 12' is used for transmitting external sound waves into the cavity 11'. Alternatively, the acoustic aperture may be defined in the substrate 20'. The substrate 20' includes a top surface 21', and a recess 200' concave from the top surface 21'. The recess 200' comprises a bottom 200a'.

The silicon condenser microphone 100' further comprises an ASIC (Application Specific Integrated Circuit) chip 30' and a MEMS die 40' having a volume 41'. The MEMS die 40' is accommodated in the cavity 11', and mounted on the top surface 21' of the substrate 20'. While mounted, the MEMS die 40' spans the recess 200', and the volume of the MEMS die 40' communicates with the recess 200'. The ASIC chip 30' is received in the recess 200' and is mounted on the bottom 200a'. Thus, the MEMS die 40' is configured to stack over the ASIC chip 30'. A height of the ASIC chip 30' is not greater than a depth of the recess 200'. Accordingly, the ASIC chip 30' has no part exposed out of the recess 200'.

By virtue of the configuration described above, the cavity 11' of the silicon condenser microphone 100' is reduced as it is only designed to receive the MEMS die 40', not both the MEMS die 40a' and the ASIC chip 30'.

The substrate 20' further comprises a plurality of first conductive paths 23' embedded therein for electrically connecting the MEMS die 40' to the ASIC chip 30'. Optionally, the first conductive path 23' may be conductive wires embedded in the substrate 20', or a conductive hole with an inner side coated with conductive layers. One end of the first conductive path 23' electrically connects to the MEMS die 40' via a plurality of first conductive members 60', and the other end of the first conductive path 23' electrically connects to the ASIC chip 40' via a plurality of second conductive members 61'. Optionally, the first conductive path 23' starts at the top surface 21' of the substrate 20', and ends at the bottom 200a' of the recess 200'.

The substrate 20 further includes a lower surface 22' opposed to the top surface 21'. A plurality of electrodes 50' are arranged on the lower surface 22' for electrically connecting to external circuits. For electrically connecting the ASIC chip 30' to the external circuit, the substrate 20' provides a plurality of second conductive paths 24' embedded therein. The second conductive path 24' starts at the bottom 200a' of the recess 200' for electrically connecting to the ASIC chip 30', and ends at the lower surface 22' for electrically connecting to the electrodes 50'. In this embodiment, the second conductive path 24' electrically connects to the ASIC chip 30' via a plurality of third conductive members 70'.

It is to be understood, however, that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A silicon condenser microphone, comprising:
  a substrate, comprising a top surface, a lower surface opposed to the top surface, and a recess concave from the top surface toward the lower surface, the recess having a bottom;
  a cover mounted with the substrate for forming a cavity;
  a chip received in the recess and mounted on the bottom;
  a transducer unit accommodated in the cavity and spanning the recess; wherein
  the transducer unit includes a volume communicating with the recess;
  the substrate comprises a plurality of first conductive paths embedded therein for electrically connecting the transducer to the chip, the first conductive path starting at the top surface for electrically connecting to the transducer, and ending at the bottom of the recess;
  and a plurality of second conductive members are sandwiched between the chip and the bottom, for electrically connecting the chip to the first conductive paths.

2. The silicon condenser microphone as described in claim 1, wherein a height of the chip is not greater than a depth of the recess.

3. The silicon condenser microphone as described in claim 2, wherein the substrate comprises a plurality of second conductive paths embedded therein for electrically connecting the transducer to an external circuit.

4. The silicon condenser microphone as described in claim 3, wherein the second conductive path starts at the top surface of the substrate, and ends at the lower surface of the substrate.

5. The silicon condenser microphone as described in claim 4 further comprising a plurality of electrodes on the lower surface for electrically connecting with the second conductive path.

6. The silicon condenser microphone as described in claim 3 further comprising a plurality of conductive wires connecting the transducer to the second conductive path.

7. The silicon condenser microphone as described in claim 2, wherein the substrate comprises a plurality of second conductive paths for electrically connecting the chip to an external circuit.

8. The silicon condenser microphone as described in claim 7, wherein the second conductive path starts at the bottom of the recess, and ends at the lower surface.

9. The silicon condenser microphone as described in claim 8 further comprising a plurality of electrodes on the lower surface for electrically connecting with the second conductive path.

10. The silicon condenser microphone as described in claim 7, wherein the substrate comprises a plurality of third conductive members sandwiched between the chip and the bottom, for electrically connecting the chip to the second conductive paths.

11. A silicon condenser microphone, comprising:
a substrate defining a top surface, a lower surface opposed to the top surface, and a recess having an opening at the top surface;
a cover engaging with the substrate for forming a cavity;
a plurality of electrodes arranged on the lower surface;
a transducer mounted on the top surface with a volume thereof communicating with the recess;
a chip received in the recess and mounted on a bottom of the recess,
wherein the substrate comprises a plurality of first conductive paths embedded therein for electrically connecting the transducer to the chip, the first conductive path starting at the top surface for electrically connecting to the transducer, and ending at the bottom of the recess;
and a plurality of second conductive members are sandwiched between the chip and the bottom, for electrically connecting the chip to the first conductive paths.

12. The silicon condenser microphone as described in claim 11, wherein the substrate comprises a plurality of first conductive paths embedded therein for electrically connecting the transducer to the chip.

13. The silicon condenser microphone as described in claim 12, wherein the substrate comprises a plurality of second conductive paths embedded therein for electrically connecting one of the chip and the transducer to the electrodes on the lower surface.

14. The silicon condenser microphone as described in claim 13, wherein the substrate comprises a plurality of third conductive members sandwiched between the chip and the bottom, for electrically connecting the chip to the second conductive paths.

* * * * *